United States Patent
Lu et al.

(10) Patent No.: US 8,539,303 B2
(45) Date of Patent: Sep. 17, 2013

(54) LOW OVERHEAD ERROR CORRECTING CODE PROTECTION FOR STORED INFORMATION

(75) Inventors: Shih-Lien L. Lu, Portland, OR (US); Dinesh Somasekhar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 342 days.

(21) Appl. No.: 12/973,880

(22) Filed: Dec. 20, 2010

(65) Prior Publication Data

US 2012/0159283 A1  Jun. 21, 2012

(51) Int. Cl.
*G06F 11/00* (2006.01)

(52) U.S. Cl.
USPC .......................................... 714/758; 714/755

(58) Field of Classification Search
USPC ................... 714/755, 758, 766, 807
See application file for complete search history.

(56) References Cited

U.S. PATENT DOCUMENTS

| | | | |
|---|---|---|---|
| 6,460,157 B1 * | 10/2002 | Chen et al. | 714/758 |
| 6,622,277 B1 * | 9/2003 | Ramanujam et al. | 714/755 |
| 6,928,515 B2 * | 8/2005 | Hassner et al. | 711/114 |
| 6,981,196 B2 * | 12/2005 | Davis et al. | 714/763 |
| 7,080,200 B2 * | 7/2006 | Hassner et al. | 711/114 |
| 7,376,886 B2 * | 5/2008 | Lin et al. | 714/764 |
| 7,895,502 B2 * | 2/2011 | Han et al. | 714/764 |
| 8,156,405 B1 * | 4/2012 | Lumb et al. | 714/770 |
| 8,190,968 B2 * | 5/2012 | Lee et al. | 714/758 |
| 8,225,171 B2 * | 7/2012 | Park | 714/758 |
| 8,234,545 B2 * | 7/2012 | Shalvi et al. | 714/768 |
| 8,239,734 B1 * | 8/2012 | Shalvi | 714/770 |
| 8,327,225 B2 * | 12/2012 | Jeddeloh | 714/763 |
| 2008/0115017 A1 * | 5/2008 | Jacobson | 714/710 |
| 2010/0064181 A1 * | 3/2010 | Moyer | 714/48 |
| 2012/0030545 A1 * | 2/2012 | Radke | 714/773 |

* cited by examiner

*Primary Examiner* — Marc Duncan
(74) *Attorney, Agent, or Firm* — Thomas R. Lane

(57) ABSTRACT

Embodiments of an invention for low overhead error-correcting-code protection for stored information are described are disclosed. In one embodiment, an apparatus includes a data storage structure, a first check value storage structure, a second check value storage structure, and check value generation hardware. The data storage structure is to store a plurality of first data values. The first check value storage structure is to store a plurality of first check values. The second check value storage structure is to store a plurality of second check values. The check value generation hardware is to generate the first check values and the second check values. The first check values provide a first level of error protection for the first data values and the second check values provide a second level of error protection for a plurality of second data values. Each of the plurality of first data value has a first data width, and each of the plurality of second data values has a second data width, the second data width being greater than the first data width. Each of the second data values is a concatenation of one of the first data values and at least another of the first data values.

16 Claims, 3 Drawing Sheets

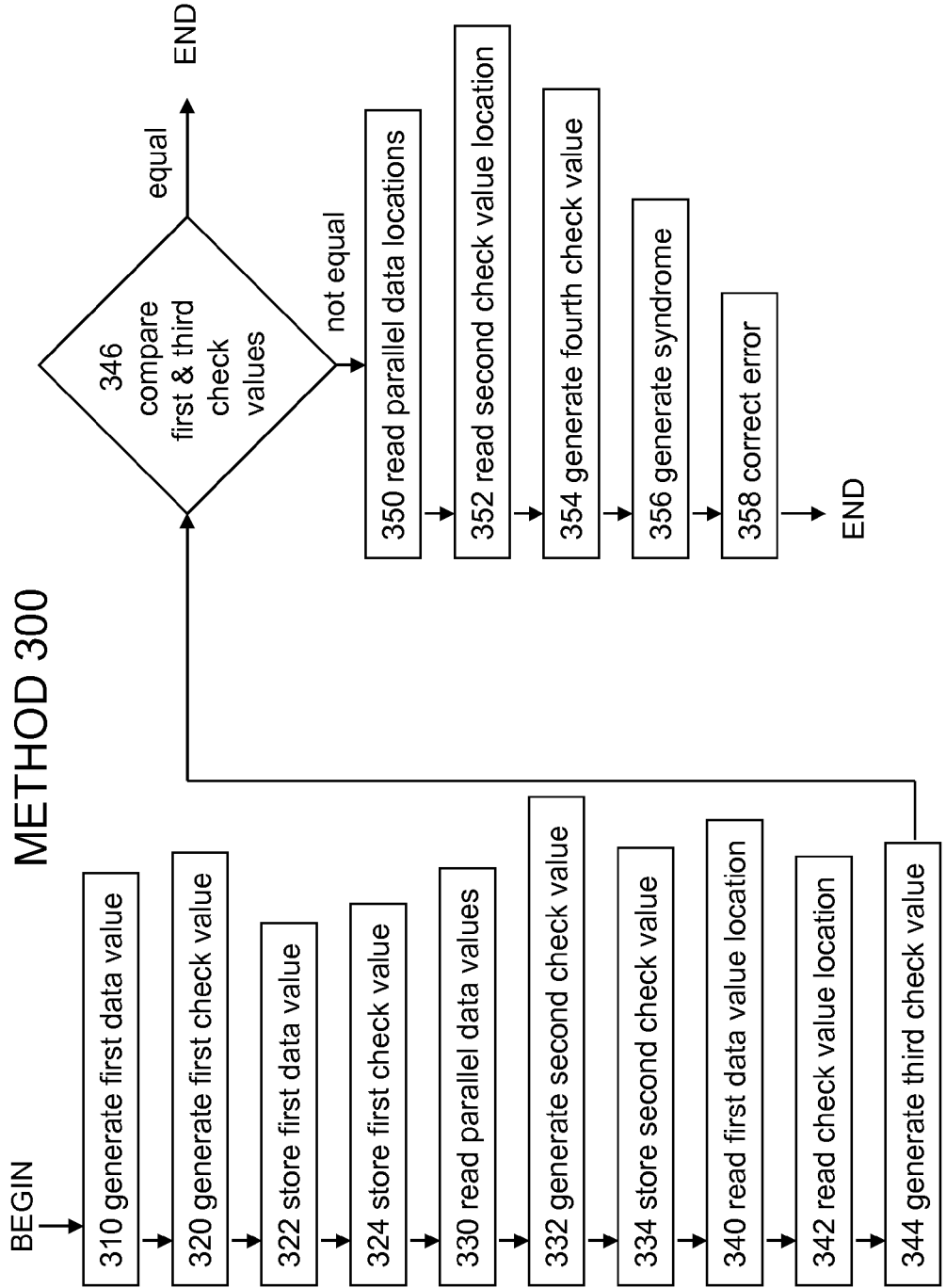

LOW OVERHEAD ERROR CORRECTING CODE PROTECTION FOR STORED INFORMATION

BACKGROUND

1. Field

The present disclosure pertains to the field of information processing, and more particularly, to the field of error detection and correction in information processing systems.

2. Description of Related Art

As improvements in integrated circuit manufacturing technologies continue to provide for greater levels of integration and lower operating voltages in microprocessors and other data processing apparatuses, makers and users of these devices are becoming increasingly concerned with the phenomenon of soft errors. Soft errors arise when alpha particles and high-energy neutrons strike integrated circuits and alter the charges stored on the circuit nodes. If the charge alteration is sufficiently large, the voltage on a node may be changed from a level that represents one logic state to a level that represents a different logic state, in which case the information stored on that node becomes corrupted. Generally, soft error rates increase as the level of integration increases, because the likelihood that a striking particle will hit a voltage node in a die increases when more circuitry is integrated into a single die. Likewise, as operating voltages decrease, the difference between the voltage levels that represent different logic states decreases, so less energy is needed to alter the logic states on circuit nodes and more soft errors arise.

Blocking certain types of particles that cause soft errors may be difficult, so data processing apparatuses often include support for detecting, and sometimes correcting, soft errors. For example, storage elements for parity or error-correcting-code (ECC) values may be added to information storage structures. However, the addition of these storage elements increases the size of the storage structure, and the increase in size is typically proportional to the level of detection/correction provided.

BRIEF DESCRIPTION OF THE FIGURES

The present invention is illustrated by way of example and not limitation in the accompanying figures.

FIG. 3 illustrates a method for low overhead ECC protection of stored data according to an embodiment of the present invention.

DETAILED DESCRIPTION

Figure 1:
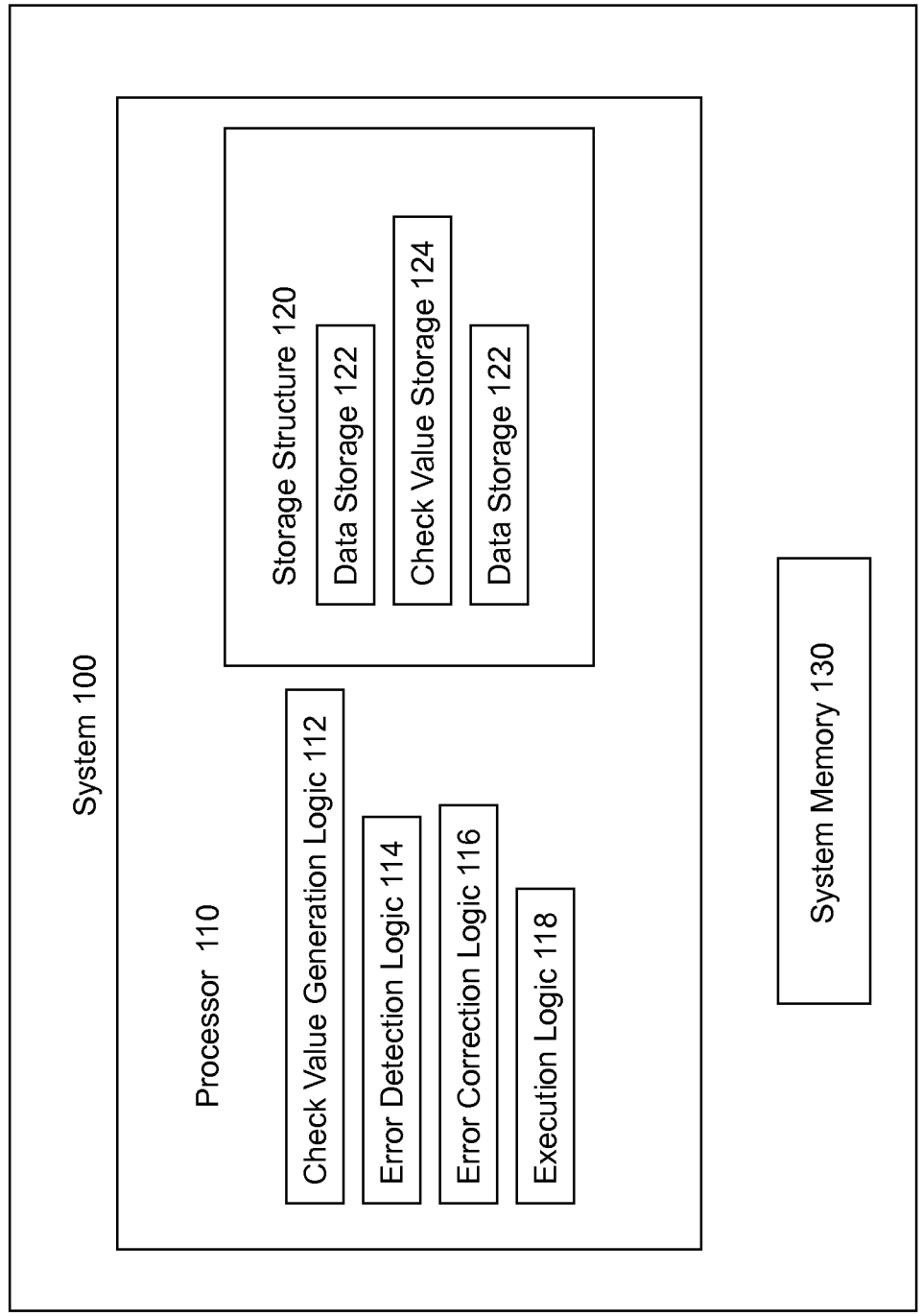
FIG. 1 illustrates an information processing system including low overhead ECC protection for stored information according to an embodiment of the present invention.

Embodiments of an invention for low overhead error-correcting-code protection for stored information are described. In this description, numerous specific details, such as processor and system configurations, may be set forth in order to provide a more thorough understanding of the present invention. It will be appreciated, however, by one skilled in the art, that the invention may be practiced without such specific details. Additionally, some well-known structures, circuits, and other features have not been shown in detail, to avoid unnecessarily obscuring the present invention. For example, a complete description of ECC techniques is not described, as a number of known approaches may be used in embodiments of the present invention. In this description, "0" (or "zero") and "1" (or "one") may be used to describe the values of binary digits ("bits") of data or other information, where the former may be any voltage or other level that represents a logical "zero" or "off" value, and the latter may be any such level that represents a logical "one" or "on" value.

As described in the background section, storage elements may be added to information storage structures to provide for error detection and/or correction in information processing systems. The overhead or cost of these additional elements is typically proportional to the level of detection/correction provided, because the Hamming distance increases as the level of protection increases. For example, single-error-detection protection for a byte of data requires one check bit (12.5% overhead), but single-error-correction, double-error-detection ("SECDED") protection for a byte of data requires four check bits (50% overhead).

Embodiments of the present invention may be desirable because they take advantage of the relationship between the data width and the number of check bits required. For example, the minimum number of check bits required to provide single-bit error correction for a data value is defined by the following equation, where "k" is the number of check bits and "m" is the number of data bits:

$$2^k > m+k+1$$

For example, eight data bits would require four check bits (50% overhead), and 256 data bits would require nine check bits (less than 4% overhead). The overhead may be reduced by increasing the width of the data value.

Embodiments of the present invention provide for a first level of error detection/correction (e.g., single-bit error detection) in a data value of a first width (e.g., eight bits), and a second level of error correction/detection (e.g., SECDED) in a data value of a second width (e.g., sixty-four bits), where the second level of error correction/detection is greater than the first level, where the second width is greater than the first width, and where data values of the second width are constructed by concatenating data values of the first width. Therefore, embodiments of the present invention may be desirable for memory arrays that are arranged in multiple banks, such as a last level cache, where the first width corresponds to the minimum width at which a data value is addressable (e.g, 8 bits) and the second width corresponds to the product of the first width and the number of banks (e.g., 8 bits*8 banks=64 bits). An embodiment of the present invention implemented on such an arrangement will be described in more detail below; however, embodiments of the present invention are not limited to such arrangements.

Moreover, embodiments of the present invention may be used for any information storage structure in any information processing system. Embodiments of the present invention may be desirable for memory arrays within a processor, such as a last level cache or a register file, because cost and performance may be particularly sensitive to the size of these data storage structures.

FIG. 1 illustrates information processing system 100 including low overhead ECC protection for a memory array according to an embodiment of the present invention. System 100 includes processor 110, storage structure 120, and system memory 130. Processor 110 includes check value generation logic 112, error detection logic 114, error correction logic 116, and execution unit 118, and, in the embodiment of FIG. 1, storage structure 120 is integrated into processor 110. However, other embodiments, in which storage structure 120 is external to processor 110, are possible within the scope of the present invention. System 100 may also include any number of additional processors, storage structures, devices, and/or any other components or elements.

Processor 110 may be any type of processor, including a general purpose microprocessor, such as a processor in the Intel® Pentium® Processor Family, Intel® Xeon® Processor Family, Intel® Core™ Processor Family, or other processor family from Intel® Corporation, or another processor from another company, or a special purpose processor or microcontroller. Processor 110 may include multiple threads and multiple execution cores, in any combination.

Check value generation logic 112 may include any circuitry, logic, or other hardware, software, firmware, or structures to generate check values to be used to detect and/or correct errors in data. For example, check value generation logic 112 may include an exclusive NOR gate to generate a parity bit that would be set to a logical '1' value when the number of inputs having a logical '1' value is odd and set to a logical '0' value when the number of inputs having a logical '1' value is even. The check values may be single parity bits, multiple parity bits, ECC values, and/or any other types of values that may be used to detect and/or correct errors in data values. For example, for a 64-bit data value, an 8-bit ECC value may be generated, where each bit of the 8-bit ECC value is generated by calculating parity over a unique half of the 64 data bits. The check value generation may be performed at any time relative to the execution of the instruction associated with the generation of the data value, fetching of the data value, and/or storing of the data value. For example, a check value may be generated in parallel with the generation of the data value, before the data value is stored, or after the data value is stored.

Error detection logic 114 may include any circuitry, logic, or other hardware, software, firmware, or structures to use the generated check values to detect errors in data values. For example, error detection logic 114 may include parity checking circuitry or logic using parity or ECC values generated by check value generation logic 112. Error detection logic 114 may indicate the detection of an error according to any known approach, such as by generating a fault or an exception.

Error correction logic 116 may include any circuitry, logic, or other hardware, software, firmware, or structures to use the generated check values to correct errors in data values. For example, error correction logic 116 may include ECC circuitry or logic to correct errors in data values using ECC values generated by check value generation logic 112.

Check value generation logic 112, error detection logic 114, and/or error correction logic 116 may be implemented separately or together, in circuitry, logic, hardware, software, firmware, or other structures dedicated to performing their function or in circuitry, logic, hardware, software, firmware, or other structures capable of performing additional functions, according to any other known approach, in whole or in part. For example, check value generation logic 112, error detection logic 114, and error correction logic 116 may be included in a general purpose arithmetic-logic unit of processor 110, and/or may be included in dedicated hardware within processor 110 and/or software or firmware executable by processor 110.

Storage structure 120 may represent any structure to store information, including data and/or instructions, in an information processing system, such as a register, a cache, or another type of memory structure. For example, storage structure 120 may represent a last level data cache memory in processor 110. Storage structure 120 may include data storage structure 122 to store data or other information, and check value storage structure 124 to store check values generated by check value generation logic 112 based on the data or other information. Alternatively, check value storage structure 124 may be included anywhere else in system 100. Data storage structure 122 and check value storage structure 124 may include any type of individual storage elements, such as latches or flip-flops, to store bits of data.

Check value generation logic 112, error detection logic 114, and/or error correction logic 116 may be coupled to data storage structure 122 and check value storage structure 124 according to any known approach to implement embodiments of the present invention as described herein. In an embodiment where data storage structure 122 corresponds to a cache memory, the cache memory may be organized as shown in FIG. 2, and check value generation logic 112 may be coupled to it in order to generate check values for the data stored or to be stored in data storage structure 122 as described in the following description of FIG. 2.

Figure 2:
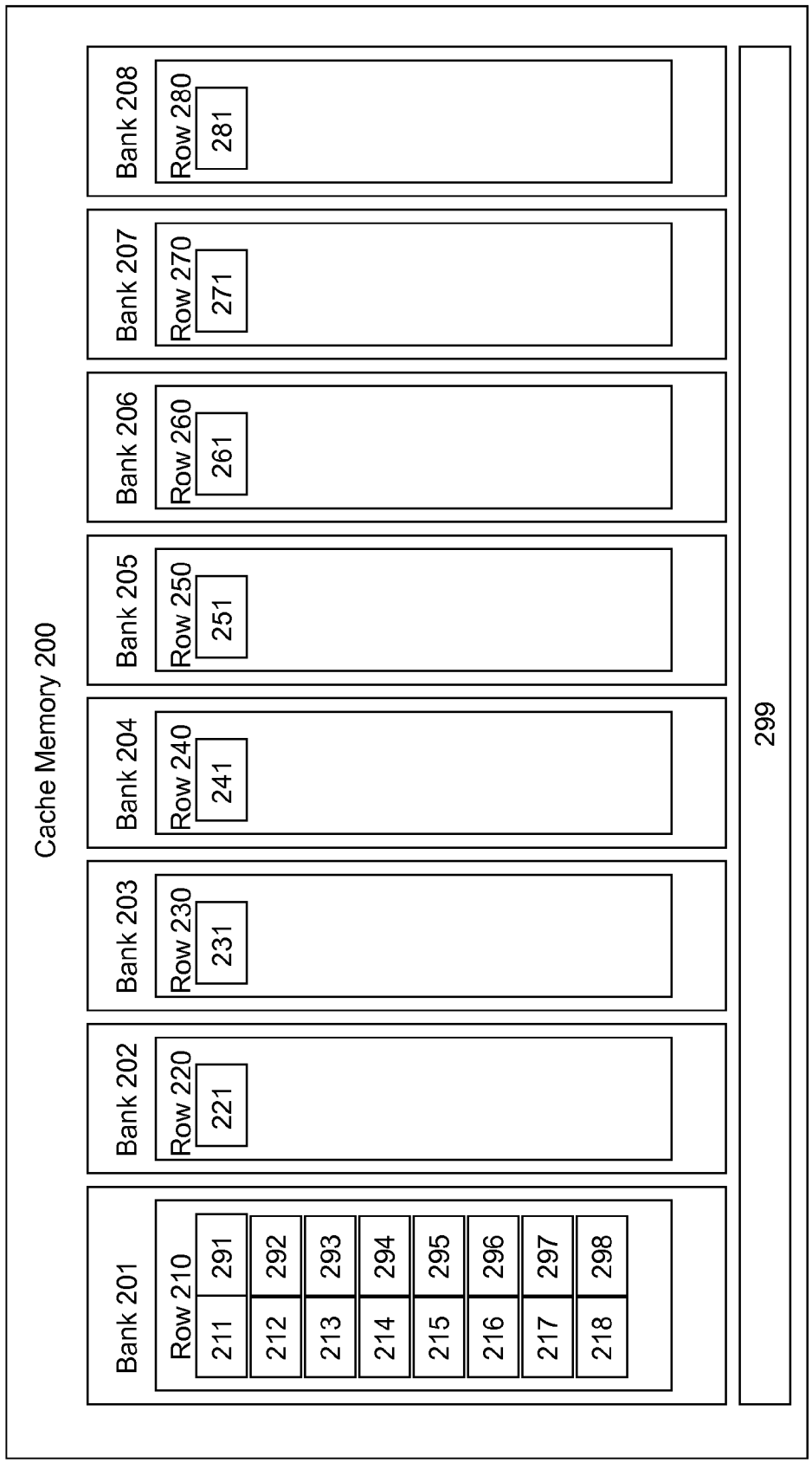
FIG. 2 illustrates a cache memory including low overhead ECC protection for stored information according to an embodiment of the present invention.

FIG. 2 illustrates cache memory 200 including low overhead ECC protection for stored information according to an embodiment of the present invention. In this embodiment, cache memory 200 includes storage for information (corresponding to data storage structure 122 in FIG. 1) and check values (corresponding to check value storage structure 124 in FIG. 1). However, other embodiments are possible within the scope of the present invention. For example, in one embodiment, data storage structure 122 and check value storage structure 124 may be included in separate arrays, structures, or components. In another embodiment, data storage structure 122 and a portion of check value storage structure 124 (e.g., parity values, each corresponding to an 8-bit data value, as described below) may be included in a single array, structure, or component, and a different portion of check value storage structure 124 (e.g., ECC values, each corresponding to a 64-bit data value, as described below) may be included in a separate array, structure, or component.

Cache memory 200 includes eight-megabytes ("MB") of data storage capacity, divided into eight 1-MB banks 201, 202, 203, 204, 205, 206, 207, and 208. Each bank has a width of eight byte locations, and each byte location in each bank is individually addressable. In other words, an address (e.g., an address used by an instruction) may reference any individual byte location in cache memory 200, and each individual byte location may be independently accessed. For example, row 210 of bank 201 includes eight byte locations, 211, 212, 213, 214, 215, 216, 217, and 218, each of which may be individually addressed and accessed.

Cache memory 200 includes check value locations to provide for a first level of error detection/correction in a data value of a first width, and a second level of error correction/detection in a data value of a second width, where the second level of error correction/detection is greater than the first level, where the second width is greater than the first width, and where data values of the second width are constructed by concatenating data values of the first width.

For example, in this embodiment the first width is a byte, so each byte location of cache memory has a corresponding check value location in cache memory 200, and each check value location is a parity bit location for storing a parity value for the data value stored in the corresponding byte location. For example, byte locations 211, 212, 213, 214, 215, 216, 217, and 218 have corresponding parity bit locations 291, 292, 293, 294, 295, 296, 297, and 298, respectively. Each parity bit value may be generated by check value generation logic such as check value generation logic 112 at any time the corresponding data value is available, and stored in a parity bit location in parallel with or at any time after the corresponding data value is stored in the corresponding byte location.

Therefore, in this embodiment the first level of error detection/correction is single-bit error detection, since error detection logic such as error detection logic 114 may use the parity bit values to detect a single bit error in any byte of data stored in cache memory 200. In other embodiments, the first data width may be any other number of bits less than the second data width, and/or the first level of error detection/correction may include any known approach to error detection/correction.

Additionally, in this embodiment, the second width is sixty-four bits, so cache memory 200 includes check value locations corresponding to 64-bit data values, and each check value location provides storage for an 8-bit ECC value based on the corresponding 64-bit data value. Each 64-bit data value is constructed by concatenating eight data values, each data value having a width of one byte, and each data value from a different bank of cache memory 200, such that the location within each bank of each of the eight data values is parallel to (i.e., in the same row and the same column within each bank, such that each of the eight locations has the same offset address) each of the other locations. For example, check value location 299 is a byte-wide location to store an 8-bit ECC value based on a 64-bit data value formed by concatenating eight 8-bit data values stored in cache memory 200; specifically, in this embodiment, the eight values are stored in byte location 211 from row 210 of bank 201, byte location 221 from row 220 of bank 202, byte location 231 from row 230 of bank 203, byte location 241 from row 240 of bank 204, byte location 251 from row 250 of bank 205, byte location 261 from row 260 of bank 206, byte location 271 from row 270 of bank 207, and byte location 281 from row 280 of bank 208.

By forming an ECC value from eight parallel byte locations from different banks, instead of another arrangement such as eight consecutive byte locations within the same bank, a byte of data may be modified without a read-modify-write operation. The embodiment of FIG. 2 may be desirable in a processor architecture in which each byte of data in system memory, and therefore in cache memory 200, is individually addressable, which may result in unaligned accesses to system memory and/or cache memory 200.

For example, if the eight byte locations are consecutive locations with the same bank, any time the value of one byte is changed, a new ECC value for the corresponding 64-bit value is generated using the unchanged values from the other bytes, so each of the other, unchanged byte values are first read from the same row of the bank to which the changed byte value will be written, then the new ECC value is generated using the changed byte value and the other, unchanged byte values, then the changed byte value is written to the same row that was read to get the other, unchanged byte values; therefore, a read-modify-write operation is used to prevent another write operation from changing one of the other byte values between the read and the write operations, which could result in the new ECC value being incorrect. Alternatively, the old value of the changed byte of data is read, the new ECC value generated based on the difference between the old value of the data and the new value of the data, and the new data value and the new ECC value are written; also using a read-modify-write operation. However, if the other, unchanged byte values are in parallel locations in different banks, then all of the other, unchanged byte values may be read in parallel with writing the new byte value, because they all have the same offset address; therefore, a read-modify-write operation is not needed. The new ECC value may be generated by check value generation logic 112, using the changed byte value along with the unchanged byte values read from the parallel byte locations, and stored after the changed byte value is written (e.g., one clock cycle later), using a bypass circuit to avoid conflicts. Storing the new ECC value after storing the changed byte value is acceptable because generation of ECC values is not on the critical path, since the ECC values are used in the event that an error is detected using a parity value.

Therefore, in this embodiment the second level of error detection/correction is SECDED, since error correction logic such as error correction logic 116 may use the ECC values to correct a single error in any 64-bit of data value stored in cache memory 200. In other embodiments, the second data width may be 256-bits, 512-bits, or any other number of bits greater than the first data width, and/or the second level of error detection/correction may include any known approach to error detection/correction.

Furthermore, embodiments of the present invention provide for simplification of error correction logic such as error correction logic 116. For example, in an embodiment where 64-bit values are protected with ECC values, and each byte of each 64-bit value is protected with a parity value, when an error in a byte is detected using a parity value, the error may be corrected using the ECC value, but instead of using every column in the parity check matrix (i.e., the H-matrix), the error may be corrected using only the columns in the parity check matrix that correspond to the location of the byte in which the parity error was detected.

FIG. 3 illustrates method 300 for low overhead error-correction-code protection of a memory array according to an embodiment of the present invention. Although method embodiments are not limited in this respect, reference may be made to elements of the embodiments of FIGS. 1 and 2 in the description of the method embodiment of FIG. 3.

In box 310, a first data value of a first width is generated, fetched, or otherwise provided; for example, a byte of data may be generated by an execution unit such as execution unit 118 in processor 110.

In box 320, a first check value is generated based on the first data value; for example, the first check value may be a parity bit for a byte of data. In box 322, the first data value is stored in a first location; for example, in location 211 of cache memory 200. In box 324, the first check value is stored in a second location; for example, in location 291 of cache memory 200.

In box 330, additional data values of the first width, to be concatenated with the first data value to construct a second data value of a second width, are read; for example, seven bytes may be read, one from each of locations 221, 231, 241, 251, 261, 271, and 281 of cache memory 200. In box 332, a second check value is generated based on the second data value; for example, the second check value may be an 8-bit ECC value based on the 64-bit data value constructed by concatenating the first data value, the data value from location 221, the data value from location 231, the data value from location 241, the data value from location 251, the data value from location 261, the data value from location 271, and the data value from location 281. In box 334, the second check value is stored in a third location; for example, in location 299 of cache memory 200.

In box 340, the contents of the first location (where the first data value was stored, e.g., location 211) are read. In box 342, the contents of the second location (where the first check value was stored, e.g., location 291) are read. In box 344, a third check value is generated based on the contents of the first location; for example, the third check value may be a parity bit for a byte of data. In box 346, the third check value is compared to the contents of the second location (where the first check value was stored, e.g., location 291). If they are equal, then no error has been detected in the contents of the first location (e.g., neither the contents of the first locations nor the second location have been changed by a soft error since the first data value and the first check value were stored). If they are not equal, then an error has been detected in the contents of the first location (e.g., either the contents of the first location or the second location have been changed by a soft error since the first data value and the first check value were stored), and method 300 continues in box 350.

In box 350, the contents of the locations from which the additional data values of the first width were read in box 340 are read; for example, seven bytes may be read, one from each of locations 221, 231, 241, 251, 261, 271, and 281 of cache memory 200. In box 352, the contents of the third location (where the second check value was stored, e.g., location 299) are read. In box 354, a fourth check value is generated based on the concatenation of the contents of the first location and the contents of the locations read in box 350; for example, the fourth check value may be an 8-bit ECC value based on the 64-bit data value constructed by concatenating the contents of location 221, location 231, location 241, location 251, location 261, location 271, and location 281. In box 356, the fourth check value is compared to the contents of the third location (the location where the second check value was stored, e.g., location 299) to generate a syndrome. In box 358, the syndrome is used to correct the error detected in box 346. In one embodiment, the error may be corrected using only the columns in the parity check matrix that correspond to the location of the byte in which the parity error was detected.

Within the scope of the present invention, the method illustrated in FIG. 3 may be performed in a different order, with illustrated boxes omitted, with additional boxes added, or with a combination of reordered, omitted, or additional boxes. For example, boxes 322 and 324 may be performed simultaneously, boxes 340 and 342 may be performed simultaneously, and/or boxes 350 and 352 may be performed simultaneously.

Thus, embodiments of an invention for low overhead error-correcting-code protection for stored information have been described. While certain embodiments have been described, and shown in the accompanying drawings, it is to be understood that such embodiments are merely illustrative and not restrictive of the broad invention, and that this invention not be limited to the specific constructions and arrangements shown and described, since various other modifications may occur to those ordinarily skilled in the art upon studying this disclosure. In an area of technology such as this, where growth is fast and further advancements are not easily foreseen, the disclosed embodiments may be readily modifiable in arrangement and detail as facilitated by enabling technological advancements without departing from the principles of the present disclosure or the scope of the accompanying claims.

What is claimed is:

1. An apparatus comprising:
    a data storage structure to store a plurality of first data values, each of the plurality of first data values having a first data width;
    a first check value storage structure to store a plurality of first check values;
    a second check value storage structure to store a plurality of second check values; and
    check value generation hardware to generate the first check values and the second check values, the first check values providing a first level of error protection for the first data values, the second check values providing a second level of error protection for a plurality of second data values, each of the plurality of second data values having a second data width, the second data width being greater than the first data width, each of the second data values being a concatenation of one of the first data values and at least another of the first data values;
    wherein the memory array is to store each of the first data values in a one of a plurality of first locations; and
    the check value generation hardware is also to generate a plurality of third check values from the contents of the plurality of first locations, compare each of the plurality of third check values to each of the plurality of first check values, generate a plurality of fourth check values from contents of the data storage structure where the plurality of second data values are stored, only if a third check value and a corresponding first check value do not match, compare each of the plurality of fourth check values to a corresponding second check value, wherein comparing a fourth check value to a second check value includes generating a syndrome; and use the syndrome to correct the contents of the corresponding first location, wherein using the syndrome includes using only the columns in a parity check matrix that correspond to the first location of a byte of the data storage structure.

2. The apparatus of claim 1, wherein the data storage structure is a memory array arranged in a plurality of banks, and each of the second data values is a concatenation of one of the first data values from each bank.

3. The apparatus of claim 2, wherein each of the one of the first data values from each bank is at the same location within each bank.

4. The apparatus of claim 2, wherein the memory array is a cache memory.

5. The apparatus of claim 1, wherein the first data width is a byte.

6. The apparatus of claim 1, wherein the second data width is sixty-four bits.

7. The apparatus of claim 1, wherein the first level of error protection is parity.

8. The apparatus of claim 1, wherein the second level of error protection is single error correction, double error detection.

9. The apparatus of claim 1, wherein the plurality of first check values is a plurality of parity values.

10. The apparatus of claim 1, wherein the plurality of second check values is a plurality of error correction code values.

11. The apparatus of claim 1, wherein each of the plurality of second check values is generated and stored without a read-modify-write operation.

12. A method comprising:
    generating a first check value to provide a first level of error protection for a first data value, the first data value having a first data width;
    generating a second check value to provide a second level of error protection for a second data value, the second data value having a second data width, the second data width being greater than the first data width, the second data values being a concatenation of the first data values and at least a third data value, the third data value having the first data width; and
    storing the first data value in a first location in a memory array;
    storing the first check value in the memory array;
    storing the second check value in the memory array;

reading the contents of the first location from the memory array;

generating a third check value from the contents read from the first location;

comparing the third check value to the first check value;

generating a fourth check value from contents of the memory array where the second data value is stored, only if the third check value and the first check value do not match comparing the fourth check value to the second check value, wherein comparing the fourth check value to the second check value includes generating a syndrome; and using the syndrome to correct the contents of the first location of the memory array, wherein using the syndrome to correct the contents of the first location of the memory array includes using only the columns in a parity check matrix that correspond to the first location of a byte of the memory array.

13. The method of claim 12, wherein the third data value is stored at the first location in a separate bank of the memory array.

14. The method of claim 12, wherein the memory array is a cache.

15. The method of claim 12, wherein storing the second check value in the memory array is done without a read-modify-write operation.

16. A system comprising:
a system memory; and
a processor having:
a cache to store a plurality of first data values from the system memory, a plurality of first check values, and a plurality of second check values, each of the plurality of first data values having a first data width; and
check value generation hardware to generate the first check values and the second check values, the first check values providing a first level of error protection for the first data values, the second check values providing a second level of error protection for a plurality of second data values, each of the plurality of data values having a second data width, the second data width being greater than the first data width, each of the second data values being a concatenation of one of the first data values and at least another of the first data values;

wherein the cache is to store each of the first data values in a one of a plurality of first locations; and the check value generation hardware is also to generate a plurality of third check values from the contents of the plurality of first locations, compare each of the plurality of third check values to each of the plurality of first check values, generate a plurality of fourth check values from contents of the cache where the plurality of second data values are stored, only if a third check value and a corresponding first check value do not match, compare each of the plurality of fourth check values to a corresponding second check value, wherein comparing a fourth check value to a second check value includes generating a syndrome; and use the syndrome to correct the contents of the corresponding first location, wherein using the syndrome includes using only the columns in a parity check matrix that correspond to the first location of a byte of the cache.

* * * * *